United States Patent [19]

Takahashi

[11] Patent Number: 4,910,469

[45] Date of Patent: Mar. 20, 1990

[54] DEMODULATOR FOR SAMPLED DATA FM SIGNALS

[75] Inventor: Minoru Takahashi, Urawa, Japan

[73] Assignee: RCA Licensing Corporation, Princeton, N.J.

[21] Appl. No.: 346,039

[22] Filed: May 2, 1989

[51] Int. Cl.[4] .................. H03D 3/00; H03K 9/06
[52] U.S. Cl. ...................... 329/320; 329/341; 329/345; 375/82
[58] Field of Search ......... 329/320, 341, 343, 345, 329/318; 375/80, 82; 455/214

[56] References Cited

U.S. PATENT DOCUMENTS

| | | | |
|---|---|---|---|
| 4,455,533 | 6/1984 | Moraillon | 329/126 |
| 4,528,511 | 7/1985 | Smith | 329/50 |
| 4,547,737 | 10/1985 | Gibson | 329/50 |
| 4,737,729 | 4/1988 | Haussmann | 329/145 |
| 4,750,214 | 6/1988 | Hart et al. | 455/214 |

FOREIGN PATENT DOCUMENTS

| | | |
|---|---|---|
| 0058050 | 8/1982 | European Pat. Off. . |
| 68571 | 1/1983 | European Pat. Off. . |
| 68579 | 1/1983 | European Pat. Off. . |
| 75071 | 3/1983 | European Pat. Off. . |
| 3138464 | 4/1983 | Fed. Rep. of Germany . |
| 3314918 | 10/1984 | Fed. Rep. of Germany . |
| 56-140705 | 11/1981 | Japan . |

OTHER PUBLICATIONS

F. G. A. Coupe, Digital Frequency Discriminator, Electronics Letters, vol. 15, No. 16, Aug. 1979, pp. 489–490.

Charles Schepers "Wie Demoduliert Man Digitalisierte FM-Träger", Funk-Technik 37 (1982) Heft 10, pp. 418–420.

Primary Examiner—Siegfried H. Grimm
Attorney, Agent, or Firm—Joseph S. Tripoli; Eric P. Herrmann; James B. Hayes

[57] ABSTRACT

A sampled data FM demodulator samples the FM signal at intervals of $(2n\pi + \pi/2)$ radians relative to the FM carrier. Pairs of samples $S_n$ and $S_{n+1}$ are square and multiplied together to generate sample values $S_n^2$, $S_{n+1}^2$ and $S_n S_{n+1}$. These sample values are lowpass filtered in a filter having a cutoff frequency which substantially attenuates at least the second harmonic of the FM carrier. The low pass filtered samples are then combined according to the relation $S_n S_{n+1}/\sqrt{S_n^2 S_{n+1}^2}$ to generate demodulated output samples.

4 Claims, 4 Drawing Sheets

DEMODULATOR FOR SAMPLED DATA FM SIGNALS

The present invention relates to detecting the instantaneous frequency of a signal with particular emphasis on digital demodulation of a frequency modulated signal.

FM discriminators or demodulators are widely used in analog systems, particularly in radio and television receivers. There is currently a trend toward developing digital techniques for processing the information signals in such receivers. Because the transfer functions of digital circuits are well defined and stable with temperature and supply variations, it is desirable to perform as much of the signal processing as possible in the digital domain. Thus there is currently developing a need for a digital demodulator of FM carriers.

F. G. A. Coupe in a paper entitled "Digital Frequency Discriminator" (Electronics Letters, Vol. 15, No. 16, Aug. 1979, pp. 489–490) describes a circuit for demodulating a FM signal using digital techniques. In the Coupe circuit the FM signal is first operated on by a Hilbert transform to derive the orthogonal components x(t) and y(t) of the complex signal.

$$f(t) = x(t) + jy(t) \tag{1a}$$

$$= a(t) \exp[j\theta(t)] \tag{2a}$$

where $$\theta(t) = \tan^{-1}[y(t)/x(t)] \tag{3a}$$

The x and y components are simultaneously sampled to develop samples x(t) and y(t). The x(t) and y(t) samples are applied to x and y processing channels. The signal of interest F(t) is derived from the first derivative of θ(t) with respect to time and given by:

$$F = \left(\frac{1}{2}\pi\right) d\theta(t)/dt = \left(\frac{1}{2}\pi\right) \frac{x\dot{y} - y\dot{x}}{x^2 - y^2} \tag{4a}$$

where the dots represent the differential operator d/dt. The first derivatives $\dot{x}$ and $\dot{y}$ are approximated by the difference values of successive samples in the x sample channel and the y sample channel, e.g., $\dot{x} = x(n+1) - x(n)$ and $\dot{y} = y(n+1) - y(n)$ etc., the value n being an index denoting the number of occurrence of a particular sample.

These derivatives are appropriately substituted into equation (4a) to produce the values, $$F(nt) \approx x(n)((y(n-1) - y(n)) + y(n)((x(n-1) - x(n)) \tag{5a}$$

$$\approx y(n)x(n-1) - x(n)y(n-1) \tag{6a}$$

In equation (5a) it will be noted that the denominator of equation (4a) was not computed since it corresponds to the amplitude of the FM signal and is presumed to be held at a predetermined constant value which simply scales the demodulated sample values by a constant. Collecting terms in equation (5a) produces equation (6a) which is seen to be a function of only four samples, two successive x(t) samples and two corresponding y(t) samples. The algorithm suggested by equation (6a) for demodulating FM signals is quite simple to implement.

On the other hand, if the FM signal is sampled at four times the unmodulated carrier frequency, alternate samples correspond to the quadrature components. The FM signal may be demodulated using pairs of successive samples. Since the demodulated signal is developed from pairs of adjacent samples taken at a relatively high sample rate signal accuracy and linearity is excellent and harmonic distortion is minimized.

SUMMARY OF THE INVENTION

The present invention includes circuitry for forming the products of adjacent samples of an FM signal, and the squares of the samples used in forming each product. In one embodiment of the invention quotients are formed by dividing the product of adjacent samples by each of the corresponding squares and the quotients are summed to provide a demodulated sample. In a further embodiment the square root of the product of the corresponding squares is formed. The product of adjacent samples is then divided by the square root to generate a demodulated sample.

DETAILED DESCRIPTION

An FM or angle modulated signal S(t) may be represented by an equation $$S(t) = (1+A(t)) \sin(W_ot + \theta(t)) \tag{1}$$

where A(t) represents an amplitude modulation of the FM signal, Wo is the carrier frequency and θ(t) corresponds to the frequency modulating signal. The signal A(t) is an undesirable signal component which should not be reflected in the demodulated signal. If the signal S(t) is sampled at intervals Δt, successive samples will correspond to $$S(t) = (1+A(t)) \sin(W_ot + \theta(t)) \tag{2 and}$$

$$S(t+\Delta t) = (1+A(t+\Delta t))\cos(W_ot + \theta(t+\Delta t)) \tag{3}$$

Multiplying equations (2) and (3) together produces the product $$S(t)S(t+\Delta t) = (1+A(t))(1+A(t+\Delta t)\sin(W_ot+\theta(t)) \\ \times \cos(W_ot+\theta(t+\Delta)) \tag{4}$$

Using trigonometric identities equation (4) may be converted to the form $$S(t)S(t+\Delta t) \\ =(1+A(t))(1+A(t+\Delta t))[\tfrac{1}{2}\sin(\theta(t)-\theta(t+\Delta t))+ \\ \tfrac{1}{2}\sin(2W_ot+\theta(t)+\theta(t+\Delta t))] \tag{5}$$

If this signal is low pass filtered using a filter having a cutoff frequency of e.g., Wo, the last term in square brackets will be eliminated, and the low pass filtered signal will take the form $$S(t)S(t+\Delta t)_{LP}=(1+A(t))(1+A(t+\Delta t))[- \\ \tfrac{1}{2}\sin(\theta(t)-\theta(t+\Delta t))] \tag{6}$$

The argument (θ(t)−θ(t+Δt)) in the sine term closely approximates the derivative dθ(t)/dt, and since Δt is very short, dθ(t)/dt is much less than one. Using the relationship that $\sin(x) \sim x$ for small values of x, equation (6) may be rewritten $$S(t)S(t+\Delta t)_{LP} = (1+A(t))(1+A(t+\Delta t))\tfrac{1}{2}d\theta(t)/dt] \quad (7)$$

where $d\theta(t)/dt$ is the desired demodulated signal. From equation (7) it is seen that the desired signal is modulated by the undesired amplitude modulating component $A(t)$ of the FM signal.

In a first embodiment the amplitude modulation terms are removed as follows. Let $A(t+\Delta t) = A(t) + \Delta A(t)$ where it is presumed that $\Delta A(t) << 1$. The term $(1+A(t+\Delta t))$ therefore becomes $(1+A(t)+\Delta A(t))$. Next consider squaring $S(t)$ and lowpass filtering the square with a filter having the cutoff frequency of Wo. The lowpass filtered square $S(t)_{LP}{}^2$ can be shown to equal $$S(t)_{LP}{}^2 = \tfrac{1}{2}(1+A(t))^2 \quad (8)$$

and the lowpass filtered square $S(t+\Delta t)_{LP}{}^2$ can be shown to equal $$S(t+\Delta t)_{LP}{}^2 = \tfrac{1}{2}(1+A(t)+\tfrac{1}{2}A(t))^2 \quad (9)$$

Dividing equation (7) by equation (8) and (9) results in the quotients $$S(t)S(t+\Delta t)_{LP}/S(t)_{LP}{}^2 = [1+\Delta A(t)/(1+A(t))] \\ d\theta(t)/dt \quad (10)$$

and $$S(t)S(t+\Delta t)_{LP}/S(t+\Delta t)_{LP}{}^2 \sim [1-\Delta A(t)/(1+A(t))] \\ d\theta(t)/dt \quad (11)$$

Summing equations (10) and (11) produces the desired demodulated signal $M(t)$ described by the equation $$M(t) = 2d\theta(t)/dt \quad (12)$$

with the AM components sufficiently suppressed.

It is noted that equation (11) is an approximation and therefore the AM components are not completely suppressed. A second embodiment provides more exact suppression of this component at the expense of slightly more complicated processing. In the second embodiment the signals defined by equations (8) and (9) are multiplied together to develop the signal $$S(t)^2 S(t+\Delta t)^2 = \tfrac{1}{4}(1+A(t))^2(1+A(t+\Delta))^2 \quad (13)$$

The square root of this signal is generated which is then used to to divide the signal $S(t)S(t+\Delta t)$ to more precisely generate the signal $M(t) = 2d\theta(t)/dt$.

Figure 1:
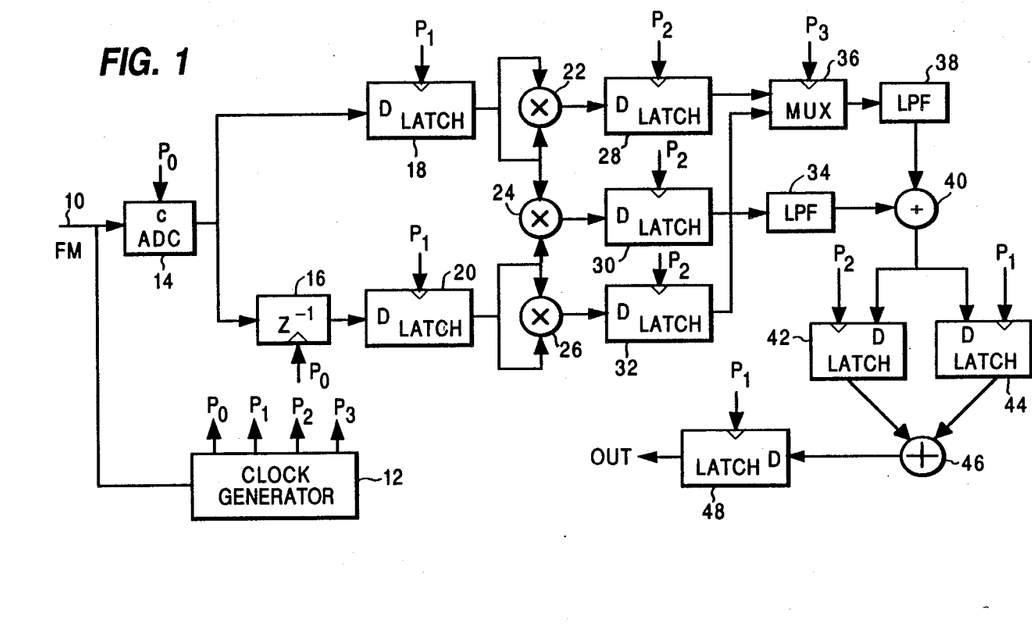
FIG. 1 is a block diagram of one embodiment of the invention.
Figure 2:
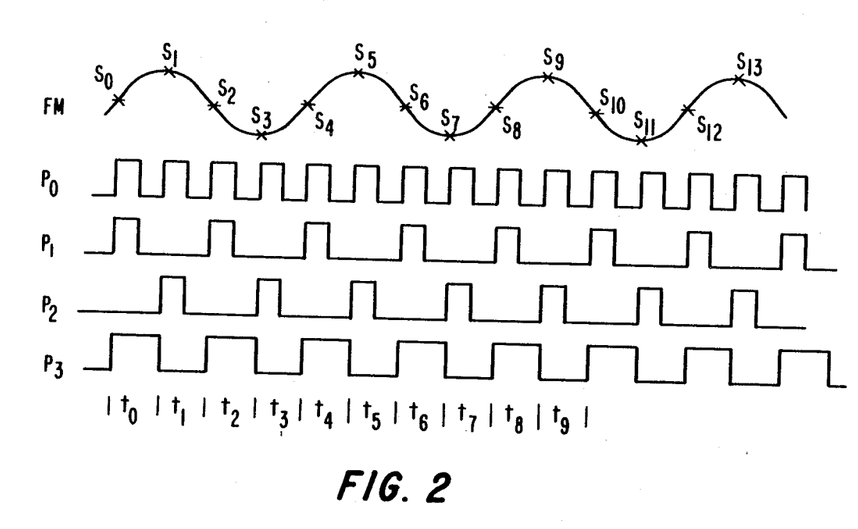
FIG. 2 illustrates control waveforms useful in describing the operation of the FIG. 1 embodiment.

Refer to FIGS. 1 and 2. In FIG. 1 an analog FM or angle modulated signal is applied at input connection 10, and coupled to an analog-to-digital-converter (ADC) 14 and a clock generator 12. The clock generator 12 develops a plurality of pulse waveforms $P_0-P_3$ which are synchronous with the unmodulated carrier component of the FM signal. Note, it is not absolutely necessary that the pulse waveforms be synchronous with the carrier. What is necessary is that pairs of samples used in each calculation approximate samples which are quadrature phase related (or approximately so) relative to the carrier. Consider the waveforms in FIG. 2. The waveform designated FM represents the FM signal, and the portion shown is chosen to correspond to an unmodulated interval. The waveform $P_o$ is a signal having a frequency which is four times the frequency of the carrier and phase locked to the carrier. The waveforms designated $P_1-P_3$ are derived from the signal $P_0$ and thus are synchronous therewith. Alternate pulses of the waveform $P_0$ are at intervals of 90 degrees relative to the carrier. If the carrier is sampled at e.g., the positive going transition of each pulse of waveform $P_0$, alternate samples will correspond to quadrature components. The same will be approximately true if the frequency of the waveform $P_0$ is substantially equal to four times the frequency of the carrier but not phase locked to the carrier.

In FIG. 1 the waveform $P_0$ is coupled to the sampling input connection of ADC 14 and conditions the ADC to generate a pulse code modulated (PCM) representation of the analog signal at each pulse occurrence. At times $t_o, t_1, t_2 \ldots$ samples $S_0, S_1, S_2 \ldots$ are generated and coupled to a data latch 18 and a one sample period delay element 16. The output of element 16 is coupled to a data latch 20. Data latches as used herein are of the type which load the data value present at their respective data input connections immediately before the positive going transition of a pulse applied to their respective clock terminals. During the time interval $t_1$ the sample values $S_1$ and $S_0$ are coupled to the latches 18 and 20. These values are loaded into the latches 18 and 20 responsive to the signal $P_1$ applied to their respective clock input terminals. In order to correlate this discussion with the foregoing analysis assume that samples $S_0$ and $S_1$ correspond to the samples $S(t)$ and $S(t+\Delta t)$, respectively.

During the interval $t_2$ the sample $S_0$ from latch 20 is coupled to both input connections of a multiplier 26 and one input connection of a multiplier 24. The sample $S_1$ from latch 18 is coupled to both input connections of a multiplier 22 and the second input connection of the multiplier 24. Multipliers 26, 24 and 22 respectively generate the products $S_0{}^2$, $S_0 S_1$ and $S_1{}^2$. At the end of interval $t_2$ these values are respectively loaded into data latches 32, 30 and 28 responsive to the signal $P_2$.

The value $S_0 S_1$ from data latch 30 is coupled via a lowpass filter 34 to the dividend input connection of a divider 40. The values $S_0{}^2$ and $S_2{}^2$ are alternately coupled via a multiplexor 36 and lowpass filter 38 to the divisor input connection of the divider 40. The lowpass filters 34 and 38 have passbands of for example the unmodulated carrier frequency. The multiplexor 36 is conditioned by the signal $P_3$ to couple the value $S_0{}^2$ to the divider 40 during interval $t_3$ and the value $S_1{}^2$ during the interval $t_4$. During the interval $t_3$ the divider 40 produces the quotient $(S_0 S_1/S_0{}^2)_{LP}$ which is loaded into the data latch 44 responsive to the signal $P_1$. During the interval $t_4$ the divider 40 produces the quotient $(S_0 S_1/S_0{}^2)_{LP}$ which is loaded into the data latch 42 responsive to the signal $P_2$. The values in latches 42 and 44 are applied to respective input terminals of an adder 46 which generates the sums $S_0 S_1/S_1{}^2 + S_0 S_1/S_0{}^2$ during the interval $t_5$. The sums provided by adder 46 are loaded into a data latch 48 controlled by the signal $P_1$. Latch 48 provides two demodulated output samples per cycle of the carrier.

The circuitry of FIG. 1, operated with the control waveforms illustrated in FIG. 2 generates successive output signals from respective pairs of samples $S_0, S_1$; $S_2, S_3$; $S_4, S_5$; etc. The frequency of the modulating signal, however, may be orders of magnitude less than the frequency of the carrier, as for example the audio signal component of a TV signal. In this instance it is unnecessary to generate output samples at as high a rate, relative to the carrier frequency, as described in the foregoing example. Timing constants on the circuitry can be alleviated by providing samples at a lower rate. For example, with appropriate changes in the control signals $P_1-P_3$, demodulated signal may be provided by generating output samples from pairs of samples such as $S_0, S_1$; $S_8, S_9$; $S_{16}, S_{17}$; ... or $S_0, S_5$; $S_8, S_{13}$; $S_{16}, S_{21}$, ... or $S_0, S_1$; $S_6, S_7$; $S_{12}, S_{13}$; ... etc. The main requirements are that the rate of demodulated output sample production satisfy the Nyquist sampling criterion relative to the information bandwidth and that the pair of samples used in each calculation be separated by $(2n\pi + \pi/2)$ radians relative to the carrier. Using this last criterion pairs of samples conducive to reducing timing complications may be represented by the sequences of pairs such as $S_n$, $S_{n+m}$; $S_{n+m}, S_{n+2m}$; $S_{n+3m}$; ... etc. where m is equal to $(1+4g)$ and g is a selected integer of 0, 1, 2, etc.

Figure 3:
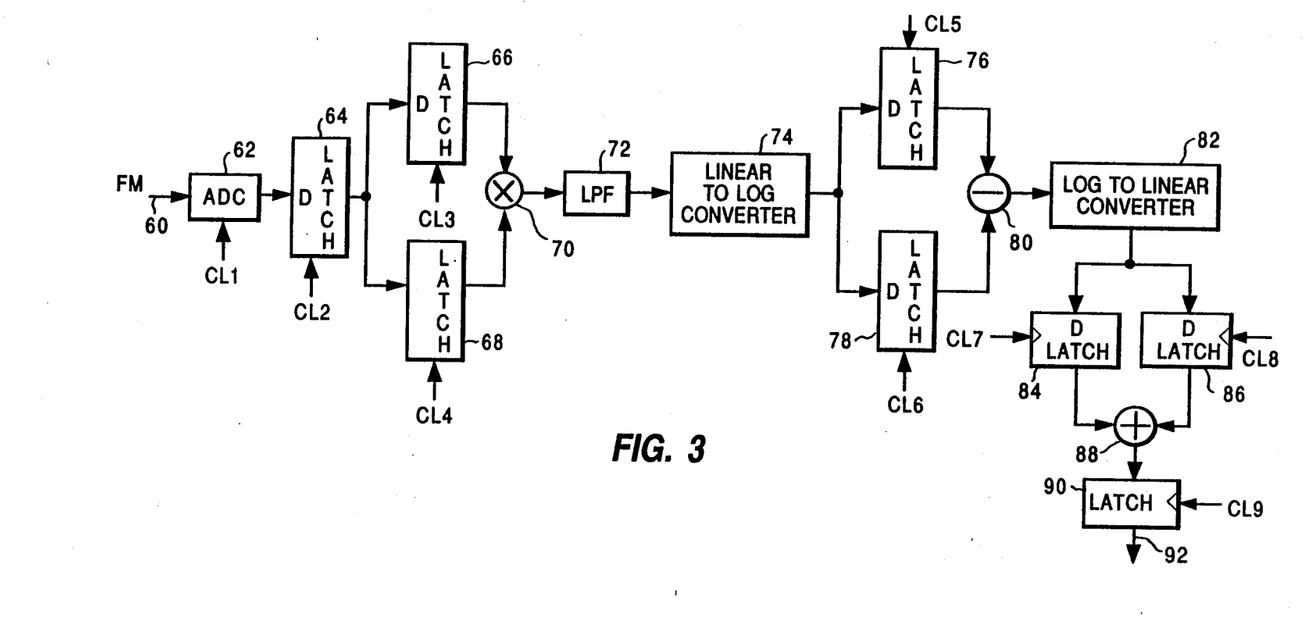
FIGS. 3 and 5 are block diagrams of alternate embodiments of the invention.
Figure 4:
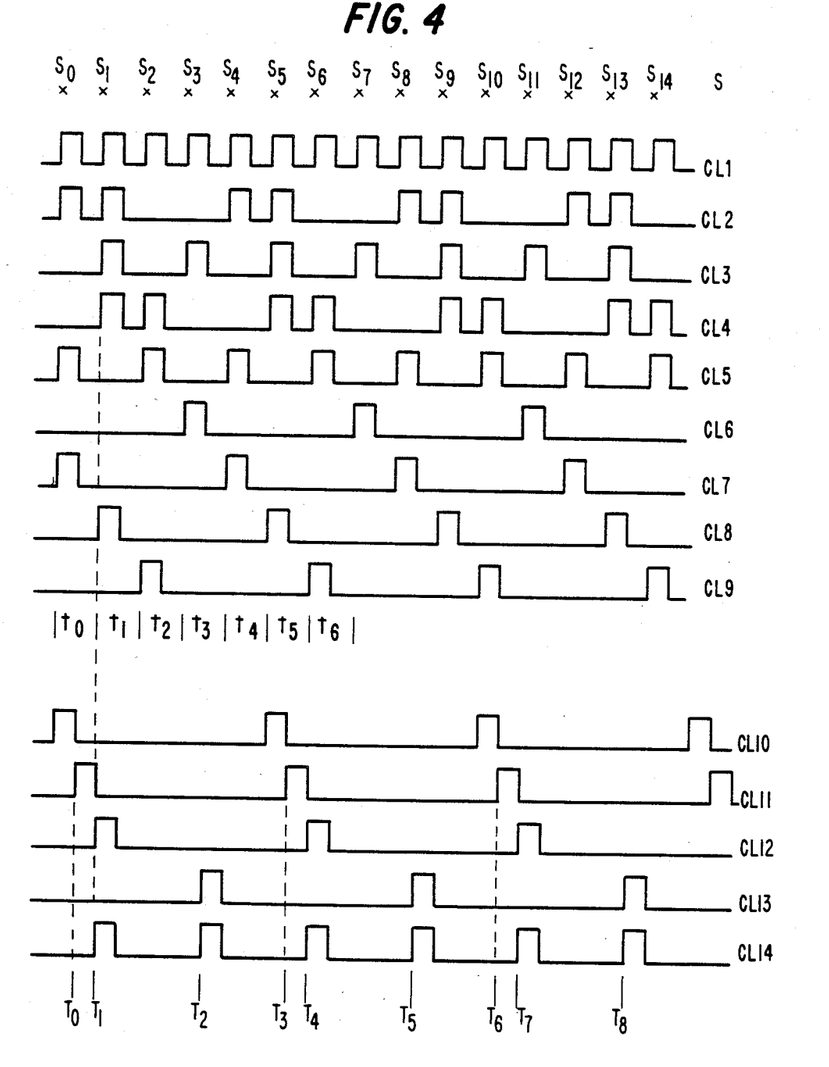
FIG. 4 illustrates clock waveforms useful in describing the operation of the FIGS. 3 and 5 embodiments.

Refer to FIGS. 3 and 4. The circuitry of FIG. 3 performs a similar function to the circuitry of FIG. 2, but time division multiplexes signals to the arithmetic circuit elements to reduce hardware, and in the following illustrative example utilizes the pairs of samples $S_0, S_1$; $S_4, S_5$; $S_8, S_9$ in developing the demodulated signal. In order to simplify the discussion it is presumed that the processing delay of the series connection of the multiplier 70, lowpass filter 72, and linear-to-log converter is an integer multiple of carrier cycles. Also the processing delay of the serial connection of the subtractor 80 and log-to-linear converter 82 is an integer multiple of carrier cycles. As such, relative to clock timing, these elements are transparent to the rest of the system. If the delays are other than integer multiples of carrier cycles those skilled in the art of circuit design will readily be able to adjust the timing of the appropriate latch circuits.

With reference to FIG. 4, the row of x's, S, respectively designated $S_i$, correspond to the sampling points $S_i$ of the waveform FM in FIG. 2. In addition, the waveform labeled CL1 corresponds to the waveform $P_0$ in FIG. 2.

In FIG. 3 the frequency or angle modulated signal is coupled to the ADC 62 which develops PCM samples responsive to the clock signal CL1. Particular ones of the PCM samples are successively loaded into the data latch 64 responsive to the clock signal CL2. For example, data latch 64 successively loads samples $S_0$, $S_1$, $S_4$, $S_5$, $S_8$, $S_9$, etc. More particularly, during interval $t_o$ (FIG. 4) latch 64 loads the sample $S_0$ and provides this sample to data latches 66 and 68. At the beginning of interval $t_1$ data latches 66 and 68 load sample $S_0$ respectively responsive to clock signals CL3 and CL4 and data latch 64 loads sample $S_1$ responsive to clock CL2. The sample $S_0$ from latches 66 and 68 is coupled to respective input terminals of a multiplier 70 which develops the product $S_0^2$ during interval $t_1$. The product $S_0^2$ is coupled to a lowpass filter 72 which attenuates signals at least above the carrier frequency. The lowpass filtered product $S_0^2{}_{LP}$ is applied to a linear-to-logarithm converter 74 which produces the logarithm of the product $S_0^2{}_{LPL}$. The product $S_0^2{}_{LPL}$ is loaded into the data latch 76 responsive to the clock signal CL5 at the termination of interval $t_2$.

During interval $t_2$ the sample $S_1$ from data latch 64 is loaded into data latch 68. At this time the respective input samples coupled to multiplier 70 are $S_0$ and $S_1$, and multiplier 70 develops the product $S_0S_1$. The product $S_0S_1$ is lowpass filtered, log-converted and loaded into the data latch 78 responsive to clock signal CL6 at the termination of interval $t_2$.

During interval $t_3$ sample $S_1$ from latch 64 is loaded into latch 66 so that sample $S_1$ is provided to both input terminals of the multiplier 70. Multiplier 70 produces the product $S_1^2$ which is lowpass filtered and log converted in elements 72 and 74. At the termination of interval $t_3$ the lowpass filtered, log-converted product $S_1^2{}_{LPL}$ is loaded into latch 76.

Simultaneously during interval $t_3$ the products $S_0^2{}_{LPL}$ and $S_0S_1{}_{LPL}$ from latches 76 and 78 are respectively coupled to the subtrahend and minuend input terminals of a subtracter 80. Subtractor 80 develops the difference $\log S_0S_1{}_{LPL} - \log S_0^2{}_{LPL}$ (corresponding to the linear quotient $S_0S_1{}_{LP}/S_0^2{}_{LP}$) which is applied to the logarithm-to-linear converter 82. The output value $S_0S_1{}_{LP}/S_0^2{}_{LP}$ is loaded into the latch 84 responsive to the clock signal CL7. During interval $T_4$ the product $S_1^2{}_{LPL}$ is loaded in latch 76 and subtracter 80 develops the difference $\log S_0S_1{}_{LPL} - \log S_1^2{}_{LPL}$. This difference is converted to the linear quotient $S_0S_1{}_{LP}/S_1^2{}_{LP}$ and loaded into the data latch 86 at the termination of interval $t_4$ responsive to the clock signal CL8. The quotients $S_0S_1{}_{LP}/S_0^2{}_{LP}$ and $S_0S_1{}_{LP}/S_1^2{}_{LP}$ are summed by the adder 88 during interval $t_5$ and loaded into the output data latch responsive to the clock signal CL9.

Since the product $S_0S_1$ may be either positive or negative, and logarithms have meaning ony for single polarity signals, it will be necessary to determine the magnitudes of the products $S_0S_1$ for application to the converter 74 and to make provision for keeping track of the polarity between the input to converter 74 and the output of converter 82. There are known techniques for accomplishing this, which have not been included in the drawing to avoid confusions. The converters 74 and 82 may be read only memories respectively programmed to provide the log and antilog values of sample values applied to their respective address input ports.

Figure 5:
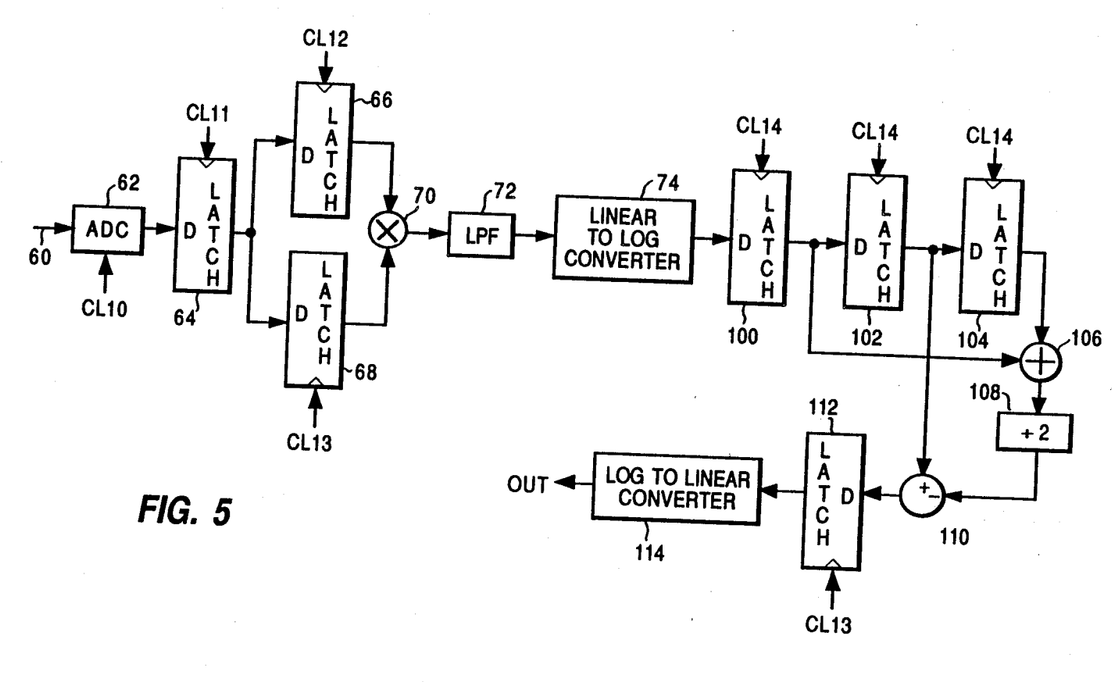

The circuitry of FIG. 5 performs the second embodiment indicated in the foregoing analytical discussion. In FIG. 5 circuit elements designated with like numbers to elements in FIG. 3 are similar and perform like funotions. The clock signals applied to elements 62–68 have been changed in this embodiment to reflect using pairs of samples $S_0, S_5$; $S_5, S_{10}$; $S_{10}, S_{15}$; ... etc. in the demodulation calculation.

At times $T_0$, $T_3$, $T_6$. . . samples $S_0$, $S_5$, $S_{10}$ are loaded into latch 64 (FIG. 5). At times $T_1$ and $T_2$, sample $S_0$ is loaded into latches 66 and 68 respectively and between times $T_2$ and $T_4$ multiplier 20 develops the product $S_0^2$. This product is filtered, converted and loaded at time $T_4$, into the data latch 100 responsive to the clock signal CL14. At time $T_4$ the sample $S_5$ is loaded into latch 66 responsive to clock signal CL12, and between times $T_4$ and $T_5$, the multiplier 70 generates the product $S_0S_5$. This product is filtered, converted and loaded into data latch 100 at time $T_5$, and the product $S_0^2$ is loaded into data latch 102. At time $T_5$ the sample $S_5$ is loaded in data latch 68 responsive to clock signal CL13 and between times $T_5$ and $T_7$ multiplier 70 generates the product $S_5^2$. This product is filtered, converted and loaded into data latch 100 at time $T_7$ and the products $S_0^2$ and $S_0S_5$ are respectively loaded into data latches 104 and 102. Remembering that the products are in logarithmic form, between times $T_7$ and $T_8$ the products $S_0^2$ and $S_5^2$ from latches 104 and 100 respectively, are summed in an adder 106 to produce a sample value corresponding to $S_0^2S_5^2$ in the linear domain. The sum is divided by two in element 108 (which corresponds to taking the square root) and coupled to the subtrahend input terminal of the subtracter 110. The product $S_0S_5$ is from data latch 102 is coupled to the minuend input of the subtracter 110. The difference values from the subtracter (which correspond to the function $S_0S_5/\sqrt{S_0^2S_5^2}$ are loaded at time $T_8$ into the data latch 112 responsive to the clock signal CL13. Samples from data latch 112 are coupled to the logarithm-to-linear converter 114 which provides linear demodulated output samples.

In this configuration, using the clock signals CL10-CL14, the rate of operation of all of the circuit elements is reduced. In addition one of the products used in the calculation of each output sample is used in the calculation of the subsequent output sample thereby reducing the number of multiplications that must be performed by one third.

Note that a single lowpass filter is illustrated in FIGS. 3 and 5. It will readily be appreciated that this filter should be arranged to independently filter the products of two different samples from the squares of like samples.

What is claimed is:

1. Apparatus for demodulating a frequency or angle modulated (FM) signal having an unmodulated carrier frequency fo, comprising:
    a signal input terminal for receiving said FM signal;
    sampling means coupled to said signal input terminal for providing samples of said FM signal, successive ones of said samples being displaced in time by an interval substantially corresponding to $(2n\pi + \pi/2)$ radians of said carrier frequency (n an integer including zero);
    means coupled to said sampling means for forming the product of two of said successive ones of said samples and for forming the respective squares of each of said two of said successive ones of said samples;
    filter means, coupled to said means for forming said product and said squares for providing filtered versions of said product and squares, wherein frequency components above said carrier frequency are significantly attenuated relative to frequency components below said carrier frequency;
    means including divider means coupled to said filter means and responsive to said filtered product and said filtered squares, for dividing said filtered product by a function of said filtered squares to produce a demodulated output sample.

2. The apparatus set forth in claim 1 wherein said means including dividing means comprises:
    means for generating respective quotients corresponding to said filtered product divided by each of said squares; and
    means for summing said respective quotients.

3. The apparatus set forth in claim 1 wherein said means including dividing means comprises:
    means responsive to said filtered squares for generating a square root value of a product of said filtered squares; and
    means, responsive to said filtered product and said square root value for generating a quotient corresponding to said filtered product divided by said square root value.

4. Apparatus for demodulating an FM signal having a carrier frequency fo, comprising:
    an FM signal input terminal;
    sampling means coupled to said FM signal input terminal for generating samples representing said FM signal, successive ones ($S_n$, $S_{n+1}$) of said samples representing amplitudes of said FM signal separated in time by intervals substantially responding to $(2n\pi + \pi/2)$ radians of said carrier frequency fo;
    means coupled to said sampling means for forming products ($S_n S_{n+1}$) of pairs of said successive ones of samples and for forming squares ($S_n^2$, $S_{n+1}^2$) of each sample of said pairs;
    means for lowpass filtering said products of pairs of samples and squares of samples; and
    means, responsive to the lowpass filtered products $(S_n S_{n+1})_{LP}$ and lowpass filtered squares $(S_n^2, S_{n+1}^2)_{LP}$ for generating output samples according to the relation $(S_n S_{n+1})_{LP}/\sqrt{(S_n^2)_{LP}(S_{n+1}^2)_{LP}}$.

* * * * *

UNITED STATES PATENT AND TRADEMARK OFFICE
CERTIFICATE OF CORRECTION

PATENT NO. : 4,910,469

DATED : March 20, 1990

INVENTOR(S) : Minoru Takahashi

It is certified that error appears in the above-identified patent and that said Letters Patent is hereby corrected as shown below:

Col. 8, line 39, "$(S_n S_{n+})_{LP} / \sqrt{(S_n^2)_{LP} (S_{n+}^2)_{LP}}$" should read $$-- (S_n S_{n+1})_{LP} / \sqrt{(S_n^2)_{LP} (S_{n+1}^2)_{LP}} --.$$

Signed and Sealed this

Ninth Day of April, 1991

*Attest:*

HARRY F. MANBECK, JR.

*Attesting Officer*     *Commissioner of Patents and Trademarks*